United States Patent
Kojima

[11] Patent Number: 5,844,783
[45] Date of Patent: Dec. 1, 1998

[54] FLEXIBLE PRINTED CIRCUIT HARNESS DEVICE AND FLEXIBLE PRINTED CIRCUIT USED THEREOF

[75] Inventor: Hiroshi Kojima, Tokyo, Japan

[73] Assignee: The Whitaker Corporation, Wilmington, Del.

[21] Appl. No.: 489,901

[22] Filed: Jun. 13, 1995

[30] Foreign Application Priority Data

Jul. 21, 1994 [JP] Japan .................................. 6-190936

[51] Int. Cl.⁶ .............................. H05K 7/02; H05K 7/06; H05K 7/10
[52] U.S. Cl. ...................... 361/777; 361/749; 361/826; 174/261; 439/67; 439/77; 439/941; 333/12
[58] Field of Search .................................. 361/749, 777, 361/785, 826; 174/117 F, 117 FF, 254, 261, 268, 72 A; 439/67, 77, 83, 493, 499, 502, 941; 257/786; 333/1, 12

[56] References Cited

U.S. PATENT DOCUMENTS

| | | | |
|---|---|---|---|
| 3,757,028 | 9/1973 | Schlessel | 174/117 FF |
| 4,381,420 | 4/1983 | Elliott et al. | 174/117 FF |
| 4,680,557 | 7/1987 | Compton | 174/117 FF |
| 4,716,500 | 12/1987 | Payne | 439/67 |
| 5,080,609 | 1/1992 | Fabian et al. | 439/67 |
| 5,224,023 | 6/1993 | Smith et al. | 439/67 |
| 5,282,751 | 2/1994 | Lwes | 439/77 |

FOREIGN PATENT DOCUMENTS

| | | | |
|---|---|---|---|
| 2-268484 | 11/1990 | Japan | 439/607 |
| 1 570 165 | 6/1980 | United Kingdom | 361/796 |

OTHER PUBLICATIONS

Korosec et al., Programmable Connector, IBM Technical Disclosure Bulletin, vol. 15, No. 3, pp. 865–866, Aug. 1972.

Primary Examiner—Michael W. Phillips
Assistant Examiner—John B. Vigushin

[57] ABSTRACT

A first electrical connector 30 and a second electrical connector 40 are installed on opposed ends of a two-sided flexible printed circuit 50, and the connectors are connected by two layers of conductive patterns. In the intermediate parts 22a and 22b, the conductors 20a of the upper-side circuit pattern and the conductors 20b of the lower-side circuit pattern are arranged so that they extend substantially parallel to each other and are shifted in a pitch direction. Accordingly, electrical connections can be realized in which crosstalk is prevented while a relatively high impedance is maintained; furthermore, the resistance of the FPC 50 to bending is also strengthened.

4 Claims, 4 Drawing Sheets

FLEXIBLE PRINTED CIRCUIT HARNESS DEVICE AND FLEXIBLE PRINTED CIRCUIT USED THEREOF

FIELD OF THE INVENTION

The present invention concerns an FPC harness device including a flexible printed circuit board (FPC) which is formed in order to transmit a plurality of signals at high speed, and an FPC used therefor.

BACKGROUND OF THE INVENTION

Various types of connecting means are used to connect computer-related devices. For example, harness devices using twisted-pair cables have conventionally been used for the mutual interconnection of devices such as disk arrays and work stations. Twisted-pair cables are flat multi-core conductor cables which have twisted parts in which pairs of lines are twisted in helical form in order to prevent crosstalk, and fused parts in which the lines are fused together at appropriate intervals along the direction of length.

In most cases, the connection of twisted-pair cables to connectors is accomplished by pressure-welding connections. In this case, fused parts of the twisted-pair cable are accommodated in the pressure-welding slots of pressure-welding terminals installed on the connector.

However, in the case of conventional harness devices using twisted-pair cables, there is a need for improvement in the following respects: first of all, as was described above, the connection of twisted-pair cables is accomplished by means of the fused parts of the cables. However, because of the need for impedance control, the distances between these fused parts cannot be shortened. Accordingly, an arbitrary length of the twisted-pair cable employed cannot be used, so that it is necessary in some cases to use an unnecessarily long length of cable, which is not appropriate for compact mounting.

Secondly, since the individual twisted pairs of a twisted-pair cable do not have an integral structure, handling is difficult, e.g., the twisted pairs may become entangled with surrounding objects, etc.

Thirdly, conventional twisted-pair cables are terminated with pressure-welding type connectors. Such pressure-welding connectors are relatively expensive, so that the harness device as a whole also becomes expensive. Accordingly, there is a need for a harness device which can be inexpensively constructed while at the same time allowing easy assembly and connection.

SUMMARY OF THE INVENTION

The present invention can be used with computer-related devices, etc. An FPC harness device including an FPC is provided. The FPC (Flexible Printed Circuit) is a two-sided FPC, i.e., an FPC which has two layers of circuit patterns. The intermediate parts of the circuit patterns are substantially parallel, and are shifted in the transverse direction, i.e., in the pitch direction.

Accordingly, by using the FPC of the present invention, it is possible to realize compact electrical connections for differential signal transmission between computer-related devices, in which crosstalk is prevented while a high impedance is maintained. Furthermore, the FPC harness device of the present invention also has economic merit in that the manufacture of the connectors and the assembly of the harness device can be accomplished relatively inexpensively. In addition, since the connectors are mechanically connected by an FPC, handling is easy, and since the intermediate parts of the FPC are reinforced by the conductors of the circuit patterns, the FPC is resistant to bending. Moreover, by selecting the FPC and circuit patterns used, different types of connectors can be effectively connected to each other, and the harness device can also be used in applications involving frequent movement of both connectors, so that there is an extremely high degree of freedom.

The object of the present invention is to provide an FPC harness device wherein an FPC is used in the device, which permits compact connections to be made between computer-related devices while preventing crosstalk and maintaining an appropriate impedance.

The present invention provides an FPC harness device comprising an FPC with circuit patterns formed on both surfaces, and a pair of connectors mounted on the FPC at the opposed ends on one surface, wherein at least the intermediate portions of the respective conductors of the upper and lower circuit patterns of the FPC extend substantially in the same direction and are shifted in the transverse direction from a back-to-back position.

Furthermore, the present invention also provides an FPC with upper and lower circuit patterns in two layers each having a plurality of conductors, wherein the FPC has connectors mounting portions formed on the FPC at the opposed ends on one surface thereof, with the connector mounting portions being mutually electrically connected by the conductors; and at least the intermediate portions of the respective conductors of the upper and lower circuit patterns of the two-sided FPC extend substantially in the same direction and are mutually shifted in the transverse direction from a back-to-back position.

The FPC harness device of the present invention has an FPC and connectors which are connected to the FPC. The FPC is a two-sided FPC, and is constructed so that the conductors forming the circuit patterns (which include circuit patterns with a two-layer structure) extend substantially parallel to each other within the respective layers and between the layers. The respective conductors of the first layer extend in the direction of length while maintaining positions that are shifted to one side in the transverse direction with respect to the respective conductors of the second layer.

BRIEF DESCRIPTION OF THE DRAWINGS

An embodiment of the invention will now be described by way of example with reference to the accompanying drawings in which.

DETAIL DESCRIPTION OF THE INVENTION

Figure 1:
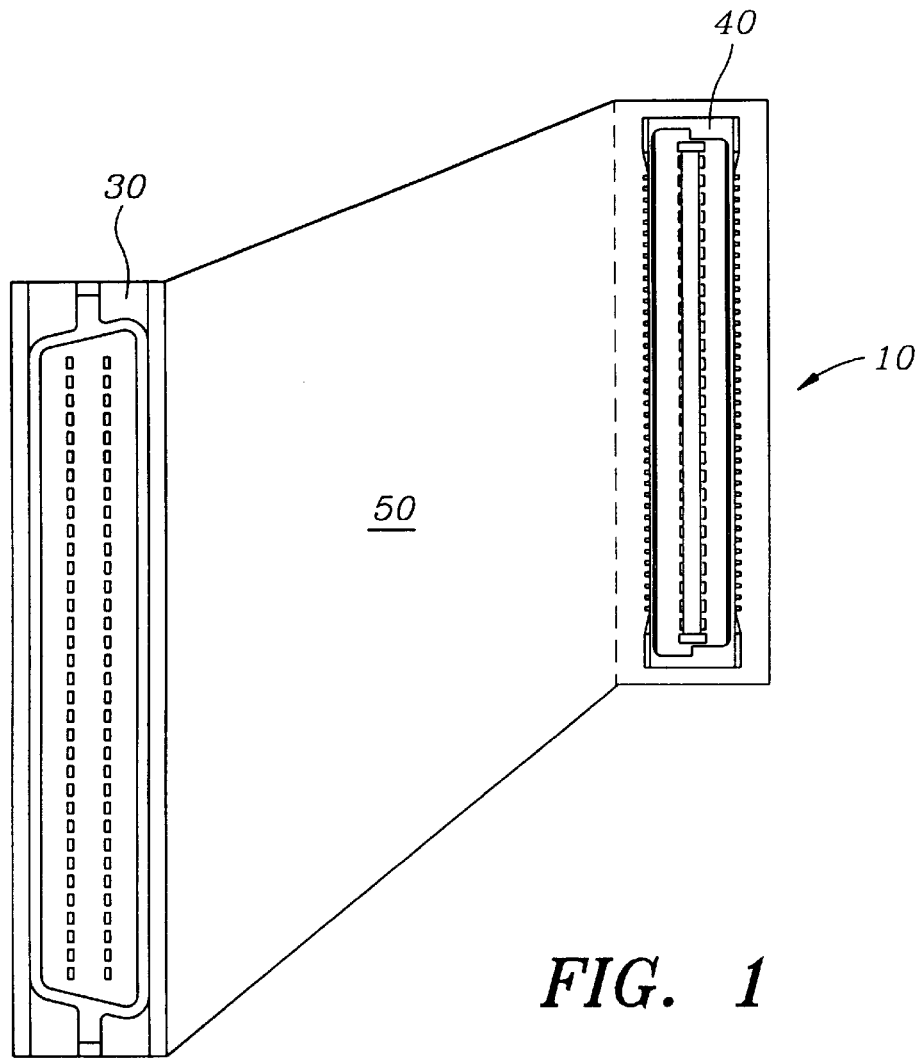
FIG. 1 is plan view of the FPC harness of the present invention.
Figure 2:
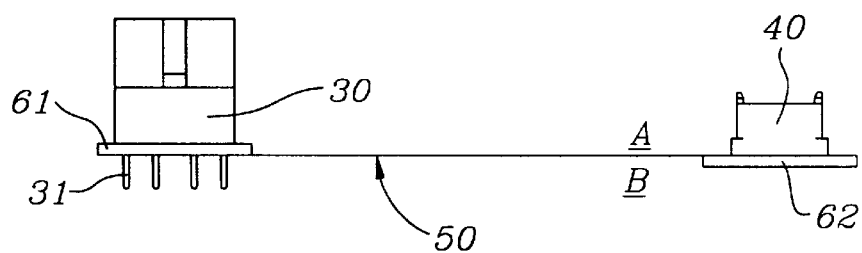
FIG. 2 is a side view of the FPC harness shown in FIG. 1.

FIGS. 1 and 2 show the FPC harness device 10 of the present invention. FPC harness device 10 has a first connector 30, a second connector 40, and an FPC (flexible printed circuit) 50 which electrically connects the first and second connectors 30 and 40. As was described above, the FPC 50 is a flexible printed circuit which has circuit patterns on both its upper and lower faces. For clarity, these circuit patterns are not shown in FIG. 1. As is shown in FIG. 1, the FPC 50 is formed so that it corresponds to the widths of the first connector 30 and second connector 40, with the portion of the FPC 50 between the connectors being formed in a substantially trapezoidal shape. Furthermore, as is shown in FIG. 2, reinforcing plates 61 and 62 are installed at the respective positions of the first connector 30 and second connector 40. These reinforcing plates 61 and 62 are formed from a heat-resistant material such as a glass-added epoxy material, and are bonded to the FPC 50. The reinforcing plates 61 and 62 facilitate the attachment of the respective connectors and smooth the bending of the FPC 50. Furthermore, the reason that the surfaces of the FPC 50 to which the reinforcing plates 61 and 62 are bonded are on opposite sides of the FPC 50 is that the contacts of the first and second connectors 30 and 40 have different forms (as will be described later).

The contacts of the first connector 30 have post-form tines or through hole solder tails 31. These tines 31 are inserted into through-holes (first connector connecting parts) 51 formed in the FPC 50 (see FIG. 3), and are connected thereto by soldering. As a result, the first connector 30 is fastened and connected to the FPC 50. Meanwhile, the contacts of the second connector 40 are soldered to pads (second connector connecting parts) 52 formed on the FPC 50 (see FIG. 3). These pads are typically referred to as surface mount solder pads. As a result, the second connector 40 is fastened to the FPC 50.

Figure 3:
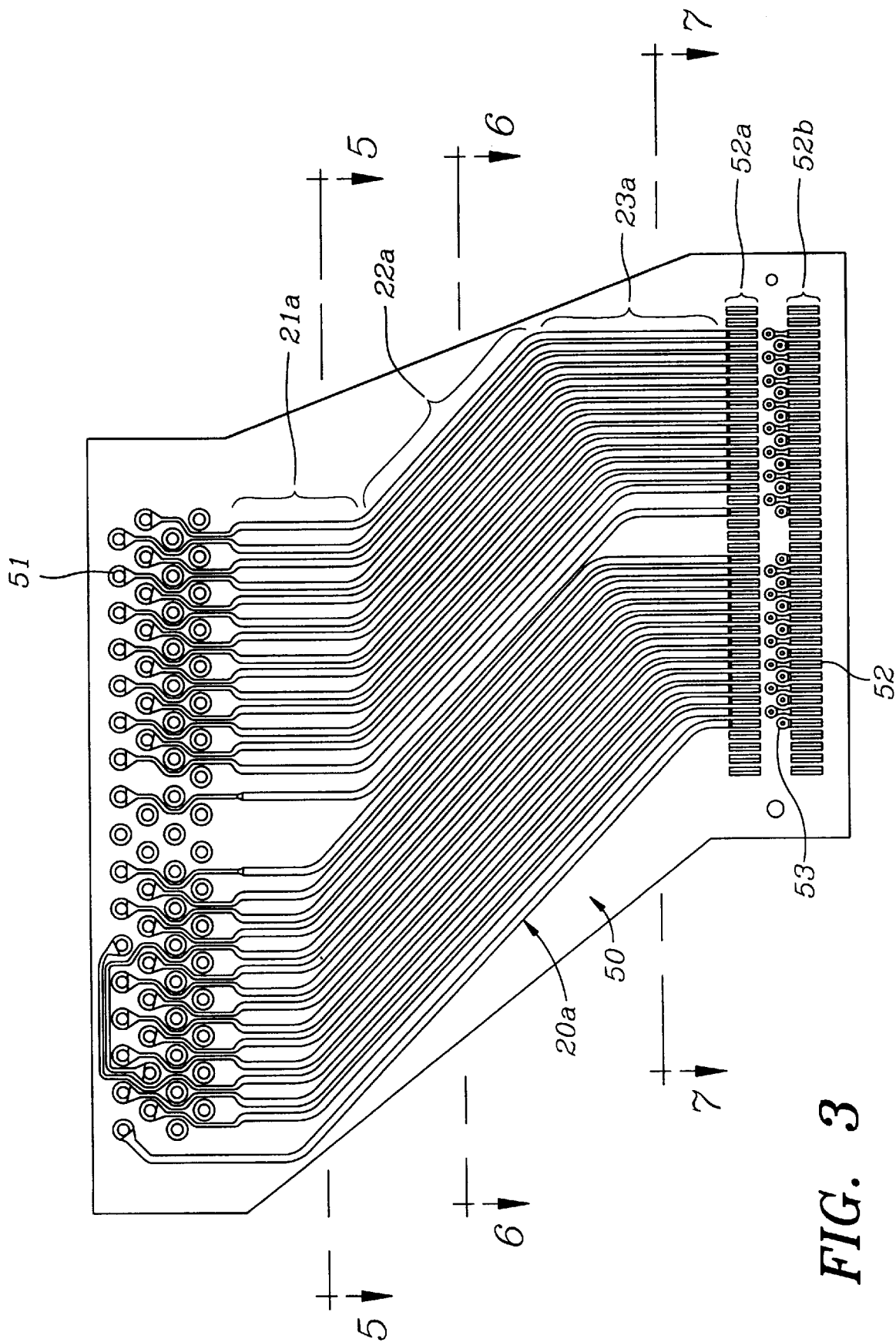
FIG. 3 is a plan view showing one side of the FPC harness illustrating the conductor pattern on side A as identified in FIG. 2. For the purposes of illustration, the top surface in this view is assumed to be transparent so that the conductor patterns are visible.
Figure 4:
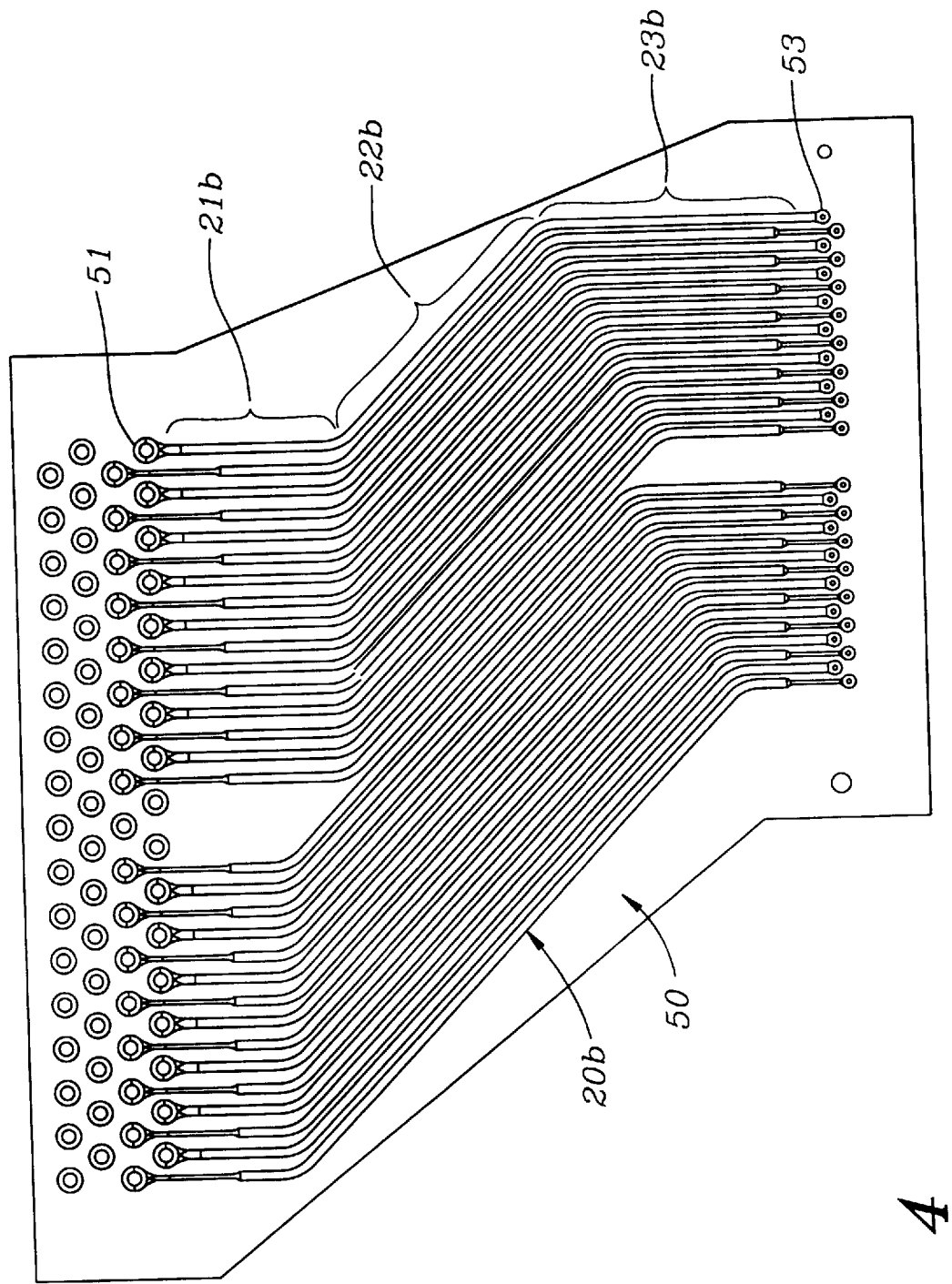
FIG. 4 is a plan view showing the opposite side of the FPC harness illustrating the conductor pattern on side B as identified in FIG. 2. For the purposes of illustration, the top surface in this view is assumed to be transparent so that the conductor patterns are visible.

FIGS. 3 and 4 show a see-through view from one side (side A in FIG. 3) of the circuit patterns formed in two layers on the FPC 50 of the present invention. Of the two layers of circuit patterns, the upper-side circuit pattern, i.e., the circuit pattern on side A in FIG. 2, is shown in FIG. 3. Each of the conductors (copper foil conductors) 20a forming the circuit pattern has a first end part 21a which extends from the corresponding through-hole 51 in a direction substantially perpendicular to the direction of length of the rows in which the through-holes 51 are arranged, an intermediate part 22a which extends diagonally from the first end part 21a, and a second end part 23a which extends from said intermediate part 22a toward the second connector 40 in substantially the same direction as the first end part 21a. Each second end part 23a is connected to a pad 52a in the front row of pads 52. Furthermore, the pads 52b in the rear row of pads 52 are connected to through-holes 53, and are electrically connected with the circuit pattern on the lower side of the FPC 50, i.e., the circuit pattern on side B in FIG. 2 (as will be described hereafter).

FIG. 4 shows the lower-side circuit pattern of the two layers of circuit patterns, i.e., the circuit pattern on side B in FIG. 2. As in the case of the conductors 20a, each of the conductors 20b forming the circuit pattern has a first end part 21b, intermediate part 22b and second end part 23b. The respective first end parts 21b, intermediate parts 22b and second end parts 23b extend parallel to the respective first end parts 21a, intermediate parts 22a and second end parts 23a of the upper-side circuit pattern. The second end parts 23b are connected to the upper-side circuit pattern via the through-holes 53, and are electrically connected to pads 52b in the rear row of the pads 52.

Figure 5:
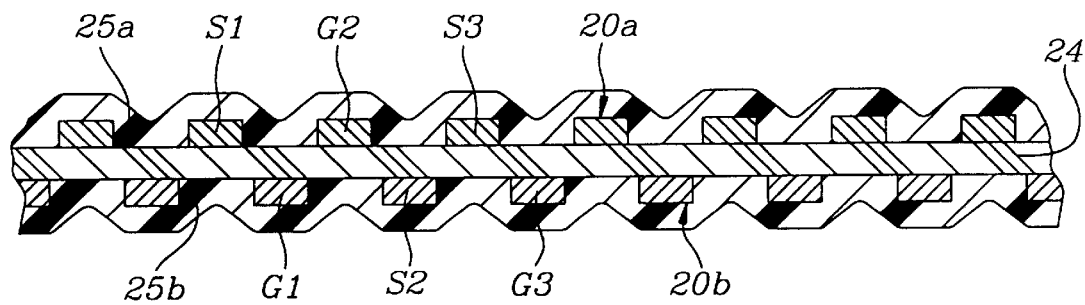
FIG. 5 is a cross-sectional view taken along line 5—5 of FIG. 3 showing the conductors in a first end part of the harness.
Figure 6:
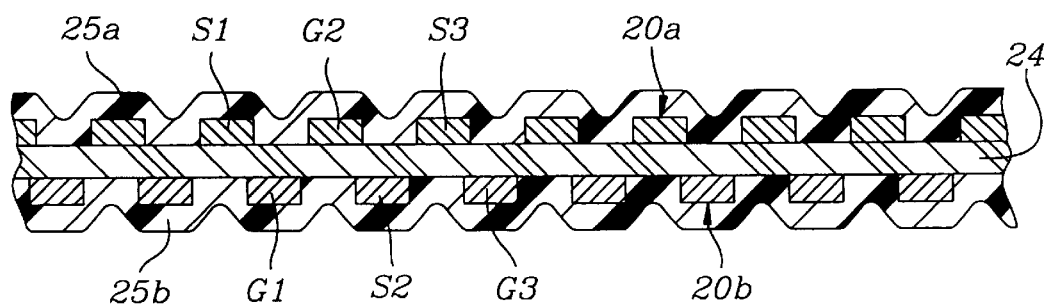
FIG. 6 is a cross-sectional view taken along line 6—6 of FIG. 3 showing the conductors in an intermediate part of the harness.
Figure 7:
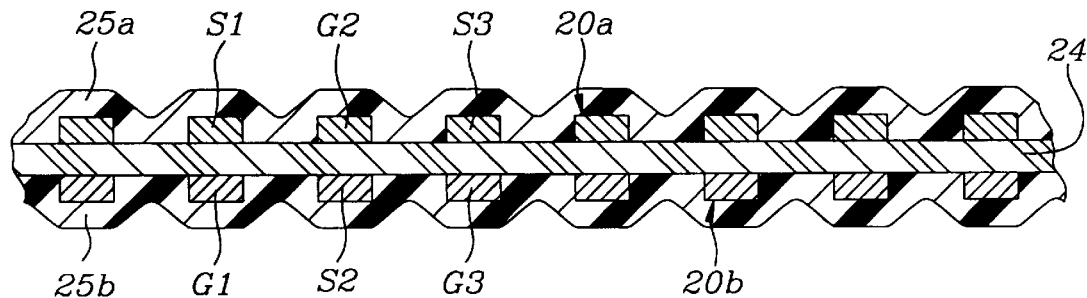
FIG. 7 is a cross-sectional view taken along line 7—7 of FIG. 3 showing the conductors in a second end part of the harness.

FIGS. 5, 6 and 7 are respective part cross-sectional views of the arrangement of the circuit patterns in the first end parts 21a and 21b, intermediate parts 22a and 22b, and second end parts 23a and 23b. The conductors 20a and 20b are installed at an appropriate pitch (interval) on both surfaces of a polyimide base 24, and are covered by respective polyimide covering layers 25a and 25b.

FIGS. 5 and 7 show respective sectional views of the first end parts 21a and 21b and second end parts 23a and 23b located near the first and second connectors 30 and 40. As is shown in FIGS. 5 and 7 and in FIGS. 3 and 4, the conductors 20a and 20b are installed at a greater pitch in the first end parts 21a and 21b than in the second end parts 23a and 23b.

In the second end parts 23a and 23b, the conductors 20a and 20b are arranged substantially back-to-back in order to facilitate connection with the second connector 40. On the other hand, in the first end parts 21a and 21b and intermediate parts 22a and 22b, the conductors 20a and 20b are shifted in the transverse direction by a substantially equal pitch, as shown in FIGS. 5 and 6. As a result, the capacitance between conductors is uniformly increased, so that the impedance can be set at a uniform and relatively high value.

Next, one example of the operation of the FPC harness device of the present invention will be described. S1 through S3 and G1 through G3 in FIGS. 5, 6 and 7 indicate that the respective conductors are for signal use (S1 through S3) or ground use (G1 through G3). In this case, differential transmission is performed using the corresponding pairs of conductors S1 and G1, S2 and G2, and S3 and G3 (hereafter indicated as S1 and G1, etc.). In the second end parts 23a and 23b, as is shown in FIG. 7, S1 and G1, etc., are disposed back-to-back. As a result, crosstalk is prevented. Meanwhile, in the first end parts 21a and 21b and intermediate parts 22a and 22b, as is shown in FIGS. 5 and 6, S1 and G1 are shifted in the transverse direction. Accordingly, crosstalk is prevented while a high impedance is maintained.

Returning to FIGS. 1 and 2, the first connector 30 and second connector 40 are attached with their engagement surfaces facing the same side of the FPC 50. Since the FPC 50 is flexible, the first and second connectors 30 and 40 can be oriented in any desired direction and engaged with mating connectors. In this case, since the FPC is installed in a bent position, the FPC is subjected to a bending load. Since the intermediate parts 22a and 22b are shifted in the transverse direction, i.e., in the pitch direction, as shown in FIG. 6, the mechanical strength with respect to such a bending load is improved compared to that obtained in the case of a back-to-back configuration such as that shown in FIG. 7.

A preferred embodiment of the present invention has been described above. However, the preferred embodiment does not limit the present invention; various modifications and changes could be made by a person skilled in the art.

I claim:

1. A flexible printed circuit harness device comprising:
   a pair of connectors disposed at opposite ends of a flexible printed circuit, wherein circuit patterns are disposed on both surfaces of the flexible printed circuit, the circuit patterns on each said surface include end portions substantially perpendicular to both ends of said flexible printed circuit and a sloped intermediate portion interconnecting respective inner ends of said circuit patterns at the both end portions, and said circuit patterns on both surfaces of said flexible printed circuit are transversely shifted from an overlapped relationship to an interleaved relationship along the length of said circuit patterns.

2. The flexible printed circuit harness device of claim 1, wherein one of said connectors is a surface mount connector while the other of said connectors has tines to be inserted into through-holes in said flexible printed circuit.

3. The flexible printed circuit harness device of claim 1, wherein a reinforcing plate is placed at both ends of said flexible printed circuit where said connectors are mounted.

4. The flexible printed circuit harness device of claim 1, wherein said circuit patterns on each said surface of said flexible printed circuit are alternately used as signal and ground conductors.

* * * * *